United States Patent
Hong et al.

(10) Patent No.: US 10,134,877 B2
(45) Date of Patent: Nov. 20, 2018

(54) ORGANIC LIGHT EMITTING DIODE DISPLAY HAVING THIN FILM TRANSISTOR SUBSTRATE USING OXIDE SEMICONDUCTOR

(71) Applicant: LG Display Co., Ltd., Seoul (KR)

(72) Inventors: Sungjin Hong, Goyang-si (KR); Byungchul Ahn, Seoul (KR); Youngju Koh, Paju-si (KR); Woojin Nam, Goyang-si (KR); Ryosuke Tani, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/094,572

(22) Filed: Apr. 8, 2016

(65) Prior Publication Data

US 2016/0225883 A1    Aug. 4, 2016

Related U.S. Application Data

(62) Division of application No. 14/446,056, filed on Jul. 29, 2014, now Pat. No. 9,318,616.

(30) Foreign Application Priority Data

Jul. 30, 2013    (KR) .................. 10-2013-0090499

(51) Int. Cl.
*H01L 29/66*    (2006.01)
*H01L 29/786*    (2006.01)
(Continued)

(52) U.S. Cl.
CPC ........ *H01L 29/66969* (2013.01); *H01L 21/44* (2013.01); *H01L 21/47635* (2013.01);
(Continued)

(58) Field of Classification Search
CPC ........... H01L 29/66969; H01L 29/7869; H01L 29/7818; H01L 29/41733; H01L 29/42356;
(Continued)

(56) References Cited

U.S. PATENT DOCUMENTS 6,144,082 A    11/2000    Yamazaki et al.
6,555,419 B2    4/2003    Oda et al.
(Continued)

FOREIGN PATENT DOCUMENTS

| CN | 1713057 A | 12/2005 |
| CN | 102013433 A | 4/2011 |
| JP | 6-77485 A | 3/1994 |

*Primary Examiner* — Michael Trinh
(74) *Attorney, Agent, or Firm* — Birch, Stewart, Kolasch & Birch, LLP

(57) ABSTRACT

A method for manufacturing an organic light emitting diode (OLED) display can include forming a gate electrode on a substrate, forming a semiconductor layer by depositing a gate insulating layer and an oxide semiconductor material and patterning the oxide semiconductor material, forming an etch stopper on a central portion of the semiconductor layer, conducting a plasma treatment using the etch stopper as a mask to conductorize portions of the semiconductor layer exposed by the etch stopper for defining a channel area, a source area and a drain area, and forming a source electrode contacting portions of the conductorized source area and a drain electrode contacting portions of the conductorized drain area.

10 Claims, 12 Drawing Sheets

(51) Int. Cl.
  *H01L 27/32* (2006.01)
  *H01L 29/417* (2006.01)
  *H01L 27/12* (2006.01)
  *H01L 21/44* (2006.01)
  *H01L 21/4763* (2006.01)
  *H01L 29/423* (2006.01)
  *H01L 29/78* (2006.01)

(52) U.S. Cl.
  CPC ...... *H01L 27/1225* (2013.01); *H01L 27/3262* (2013.01); *H01L 27/3272* (2013.01); *H01L 29/41733* (2013.01); *H01L 29/42356* (2013.01); *H01L 29/7869* (2013.01); *H01L 29/7818* (2013.01); *H01L 2227/323* (2013.01)

(58) Field of Classification Search
  CPC ............... H01L 21/47635; H01L 21/44; H01L 27/3262; H01L 27/3272; H01L 27/1225; H01L 2227/323
  See application file for complete search history.

(56) References Cited

U.S. PATENT DOCUMENTS

| | | | |
|---|---|---|---|
| 6,812,054 B2 | 11/2004 | Joo | |
| 7,807,486 B2 | 10/2010 | Kwack | |
| 7,863,120 B2* | 1/2011 | Chae | G02F 1/1368 257/E21.407 |
| 7,923,736 B2 | 4/2011 | Lee | |
| 8,178,884 B2 | 5/2012 | Ha et al. | |
| 8,227,804 B2 | 7/2012 | Yang et al. | |
| 8,324,629 B2 | 12/2012 | Jeong et al. | |
| 8,384,078 B2 | 2/2013 | Kang et al. | |
| 8,399,274 B2 | 3/2013 | Kang et al. | |
| 8,546,811 B2* | 10/2013 | Godo | H01L 29/7869 257/258 |
| 8,618,544 B2 | 12/2013 | Dairiki et al. | |
| 8,624,321 B2 | 1/2014 | Yamazaki et al. | |
| 8,749,725 B2 | 6/2014 | Yoon et al. | |
| 2004/0075783 A1 | 4/2004 | Lee | |
| 2005/0285195 A1 | 12/2005 | Choi et al. | |
| 2008/0057607 A1 | 3/2008 | Oke et al. | |
| 2011/0057181 A1 | 3/2011 | Choi et al. | |
| 2011/0297948 A1 | 12/2011 | Jeong et al. | |
| 2012/0223308 A1* | 9/2012 | Okabe | G02F 1/1368 257/43 |
| 2013/0140554 A1 | 6/2013 | Yamazaki et al. | |
| 2013/0140635 A1* | 6/2013 | Yan | H01L 27/1225 257/347 |
| 2014/0027760 A1 | 1/2014 | Chang et al. | |
| 2014/0231810 A1* | 8/2014 | Park | H01L 29/41733 257/66 |

* cited by examiner

ORGANIC LIGHT EMITTING DIODE DISPLAY HAVING THIN FILM TRANSISTOR SUBSTRATE USING OXIDE SEMICONDUCTOR

CROSS-REFERENCE TO RELATED APPLICATION

This application is a Divisional of co-pending U.S. application Ser. No. 14/446,056 filed on Jul. 29, 2014, now U.S. Pat. No. 9,318,616, which claims the benefit of and priority to Korea Patent Application No. 10-2013-0090499 filed on Jul. 30, 2013, which are all hereby incorporated by reference for all purposes as if fully set forth herein.

BACKGROUND OF THE INVENTION

Field of the Invention

The present disclosure relates to a thin film transistor substrate having an oxide semiconductor material for an organic light emitting diode display and a method for manufacturing the same. Especially, the present disclosure relates to an organic light emitting diode display having a thin film transistor substrate in which a channel area and a source-drain area in an oxide semiconductor layer are defined by an etch stopper layer and a method for manufacturing the same.

Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or EL).

The electroluminescence display device is categorized in the inorganic light emitting diode display device and the organic light emitting diode display device according to the luminescence material. As a self-emitting display device, the electroluminescence display device has the merits that the response speed is very fast, the brightness is very high and the view angle is large.

FIG. 1 is a diagram illustrating the structure of the organic light emitting diode. As shown in FIG. 1, the organic light emitting diode comprises the organic light emitting material layer, and the cathode and the anode which are facing each other with the organic light emitting material layer therebetween. The organic light emitting material layer comprises the hole injection layer HIL, the hole transport layer HTL, the emission layer EML, the electron transport layer ETL and the electron injection layer EIL. The organic light emitting diode radiates light due to the energy from the excitation formed at the excitation state in which the hole and the electron are recombined at the emission layer EML. The organic light emitting diode display can represent the video data by controlling the amount (or 'brightness') of the light generated and radiated from the emission layer ELM of the organic light emitting diode as shown in FIG. 1.

The organic light emitting diode display (or OLED) using the organic light emitting diode can be categorized in the passive matrix type organic light emitting diode display (or PMOLED) and the active matrix type organic light emitting diode display (or AMOLED).

The active matrix type organic light emitting diode display (or AMOLED) shows the video data by controlling the current applying to the organic light emitting diode using the thin film transistor (or TFT).

FIG. 2 is the exemplary circuit diagram illustrating the structure of one pixel in the active matrix organic light emitting diode display (or AMOLED). FIG. 3 is a plane view illustrating the structure of one pixel in the AMOLED. FIG. 4 is a cross-sectional view along the cutting line I-I' for illustrating the structure of the AMOLED.

Referring to FIGS. 2 and 3, the active matrix organic light emitting diode display comprises a switching thin film transistor ST, a driving thin film transistor DT connected to the switching thin film transistor ST, and an organic light emitting diode OLED connected to the driving thin film transistor DT. By a scan line SL, a data line DL and a driving current line VDD disposed on a substrate SUB, a pixel area is defined. The organic light emitting diode OLED is formed in one pixel area and defines a light emitting area within the pixel area.

The switching thin film transistor ST is formed where the scan line SL and the data line DL cross each other. The switching thin film transistor ST is provided to select the pixel which is connected to the switching thin film transistor ST. The switching thin film transistor ST includes a gate electrode SG connected to the gate line GL, a semiconductor channel layer SA overlapping with the gate electrode SG a source electrode SS and a drain electrode SD. The driving thin film transistor DT is provided to drive an anode electrode ANO of the organic light emitting diode OD disposed at the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLED. Between the anode electrode ANO and the cathode electrode CAT, the organic light emitting layer OLE is disposed. The cathode electrode CAT is connected to the base voltage VSS. Between the gate electrode DG of the driving thin film transistor DT and the driving current line VDD or between the gate electrode DG of the driving thin film transistor DT and the drain electrode DD of the driving thin film transistor DT, a storage capacitance Cst is formed.

Referring further to FIG. 4, the gate electrodes SG and DG of the switching thin film transistor ST and the driving thin film transistor DT are respectively formed on the substrate SUB of the active matrix organic light emitting diode display. On the gate electrodes SG and DG, the gate insulator GI is deposited. On the gate insulator GI overlapping with the gate electrodes SG and DG, the semiconductor layers SA and DA are formed, respectively. On the semiconductor layer SA and DA, the source electrode SS and DS and the drain electrode SD and DD facing and separating from each other are formed. The drain electrode SD of the switching thin film transistor ST is connected to the gate electrode DG of the driving thin film transistor DT via the contact hole penetrating the gate insulator GI. The passivation layer PAS is deposited on the substrate SUB having the switching thin film transistor ST and the driving thin film transistor DT.

Especially, the semiconductor layers SA and DA made of oxide semiconductor materials, thanks to their characteristics of high electron mobility, have advantageous such as high resolutions and high-speed operations and thus can be used for a large area thin film transistor substrate having a large charging capacitor. However, in order to ensure the stability of the oxide semiconductor material, it is preferable to include an etch stopper SE and DE covering the upper surface of channel area to protect them from etchants. In detail, the etch stoppers SE and DE may be formed to protect the semiconductor layers SA and DA from being back-etched by the etchant for patterning the source electrodes SS and DS and the drain electrodes SD and DD.

A color filer is formed at the area where the anode electrode ANO will be formed later. It is preferable for the color filter CF to have as large an area as possible. For example, it is preferable to overlap with some portions of the data line DL, the driving current line VDD and/or the scan line SL. The upper surface of the substrate having these thin film transistors ST and DT and color filters CF is not in even and/or smooth conditions, but in uneven and/or rugged conditions having different levels. To ensure that the organic light emitting diode display has good luminescent quality over the whole display area, the organic light emitting layer OLE should be formed on an even or smooth surface. So, to make the upper surface in planar and even conditions, the over coat layer OC is deposited on the whole surface of the substrate OC.

Then, on the over coat layer OC, the anode electrode ANO of the organic light emitting diode OLED is formed. Here, the anode electrode ANO is connected to the drain electrode DD of the driving thin film transistor DT through the contact hole penetrating the over coat layer OC and the passivation layer PAS.

On the substrate SUB having the anode electrode ANO, a bank BANK is formed over the area having the switching thin film transistor ST, the driving thin film transistor DT and the various lines DL, SL and VDD, for defining the light emitting area. The exposed portion of the anode electrode ANO by the bank BANK may be the light emitting area. On the anode electrode ANO exposed from the bank BANK, the organic light emitting layer OLE is formed. On the organic light emitting layer OLE, the cathode electrode ACT is formed.

For the case that the organic light emitting layer OLE has a material emitting the white light, each pixel can represent various colors by the color filter CF disposed under the anode electrode ANO. The organic light emitting diode display as shown in FIG. 4 is the bottom emission type display in which the visible light is radiated to the bottom direction of the display substrate.

In the organic light emitting diode display having the oxide semiconductor material like the above-mentioned structure, the source-drain electrodes SS-SD and DS-DD are overlapped with some portions of the etch stoppers SE and DE. Especially, some area of the semiconductor layers SA and DA corresponding to the lengths between the source electrodes SS and DS and the drain electrodes DS and DD are defined as the channel area. Due to these overlapped area, the total area of the semiconductor layers SA and DA may be larger than necessary area for ensuring the effective channel area. Further, at these overlapped areas, some parasitic capacitances may be formed, for example, between source-drain electrodes SS-SD and DS-DD and the gate electrodes SG and DG. As the overlapped area is getting larger, the amount of the parasitic capacitance would be increased. This may cause many undesirable effects on the thin film transistor.

SUMMARY OF THE INVENTION

In order to overcome the above mentioned drawbacks, the purpose of the present disclosure is to suggest an organic light emitting diode display having a thin film transistor substrate including an oxide semiconductor of which the channel area is not overlapped with the source-drain electrode, and a method for manufacturing the same. Another purpose of the present disclosure is to suggest a thin film transistor substrate and a method for manufacturing the same in which the channel area and the source-drain area is precisely defined by the etch stopper and in which the channel area is not overlapped with the source-drain electrode by which the source-drain electrode is connected to some portions of the source-drain area.

In order to accomplish the above purpose, the present disclosure suggests an organic light emitting diode display comprising: a gate electrode formed on a substrate; a gate insulating layer covering the gate electrode; a semiconductor layer formed on the gate insulating layer as overlapping with the gate electrode, and including a channel area and a source area and drain area which are extended from the channel area to both outsides, respectively and conductorized; an etch stopper covering the channel area and exposing the source area and the drain area; a source electrode contacting to some portions of the exposed source electrode; and a drain electrode contacting to some portions of the exposed drain electrode.

In one embodiment, the source electrode contacts with the some portions which are apart from the channel area to the one outside with a first predetermined distance, and the other portions of the source area between the source electrode and the channel area are exposed; and wherein the drain electrode contacts with the some portions which are apart from the channel area to the other outside with a second predetermined distance, and the other portions of the drain area between the source electrode and the channel area are exposed.

In one embodiment, the source electrode and the drain electrode include a first metal layer and a second metal layer stacked on the first metal layer.

In one embodiment, the etch stopper is disposed on a whole surface of the substrate on the semiconductor layer, and includes a source area hole exposing the source area and a drain area hole exposing the drain area.

In one embodiment, the etch stopper and the channel area have a size and a shape that is the same with those of the gate electrode.

In one embodiment, the semiconductor layer includes an oxide semiconductor material and; wherein the source area and the drain area are formed by conductorizing the oxide semiconductor material.

Furthermore, the present disclosure suggests a method for manufacturing an organic light emitting diode display comprising: forming a gate electrode on a substrate; forming a semiconductor layer by depositing a gate insulating layer and an oxide semiconductor material and patterning the oxide semiconductor material; forming an etch stopper covering a central portions of the semiconductor layer; conducting a plasma treatment using the etch stopper as a mask to conductorize some portions of the semiconductor layer exposed by the etch stopper for defining a channel area, a source area and a drain area; and forming a source electrode contacting with some portions of the conductorized source area and a drain electrode contacting with some portions of the conductorized drain area.

In one embodiment, the forming the etch stopper includes: depositing an insulating layer on the semiconductor layer; and forming a source area hole exposing the source area and a drain area hole exposing the drain area by patterning the insulating layer using a mask.

In one embodiment, the forming the etch stopper includes: depositing an insulating layer on the semiconductor layer; patterning the etch stopper with a back exposure method using the gate electrode as a mask so that the source area and the drain area are exposed and the channel area is covered by the etch stopper.

In one embodiment, in the forming the source electrode and the drain electrode, the source electrode contacts some portions of the source area which are apart from the channel area with a first predetermined distance, and other portions of the source area between the source electrode and the channel area are exposed; and the drain electrode contacts some portions of the drain area which are apart from the channel area with a second predetermined distance, and other portions of the drain area between the drain electrode and the channel area are exposed.

In one embodiment, the forming the source electrode and the drain electrode includes: depositing a first metal layer and a second metal layer sequentially on the etch stopper; patterning the second metal layer with an wet etching method; and patterning the first metal layer with a dry etching method using the patterned second metal layer as a mask.

The thin film transistor substrate having an oxide semiconductor layer according to present disclosure has the channel area and the source-drain area which are precisely defined by conductorizing the oxide semiconductor layer using the etch stopper as a mask. That is, the channel area can be formed as having the minimized length using the etch stopper. Further, the source-drain electrodes are connected to the conductorized source-drain areas of the oxide semiconductor layer, respectively. As the result, the channel area is not overlapped with the source-drain electrodes, and the thin film transistor having the good current characteristics can be acquired. In addition, when using the back exposure process, the gate electrode, the channel area and the etch stopper can be formed as having the same shape and area, so that even in the bottom gate structure, it is possible to get the merit of the top gate structure in which the parasitic capacitance of the gate-source electrodes and the gate-drain electrodes can be eliminated.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE EMBODIMENTS

Figure 1:
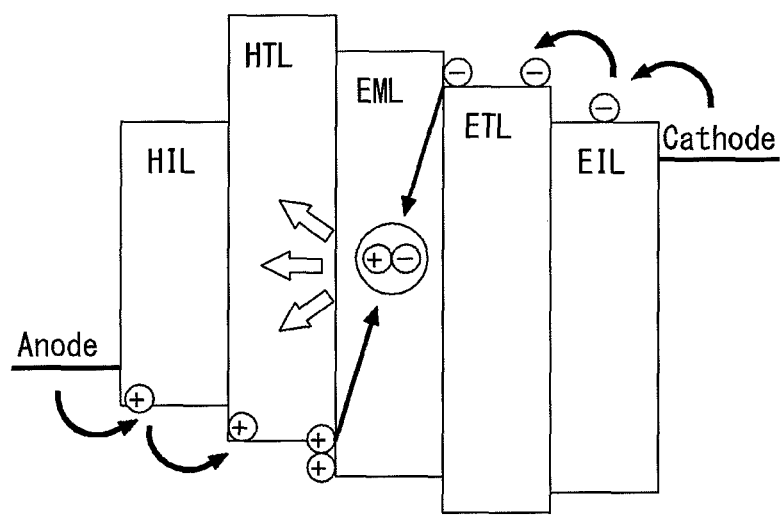
FIG. 1 is a diagram illustrating the structure of the organic light emitting diode according to the related art.
Figure 2:
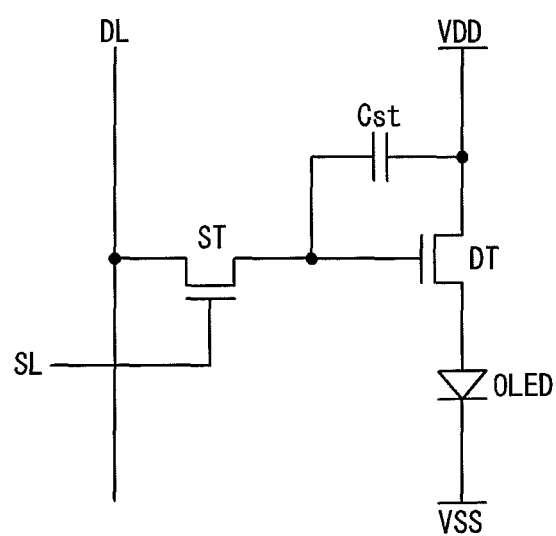
FIG. 2 is an exemplary circuit diagram illustrating the structure of one pixel in the active matrix organic light emitting diode display (or AMOLED) according to the related art.
Figure 3:
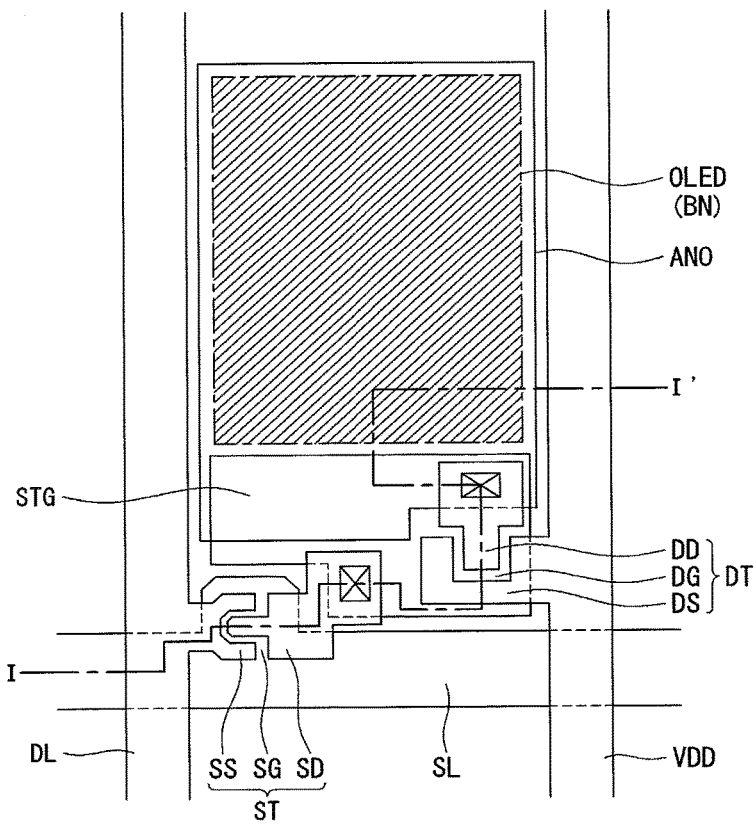
FIG. 3 is a plane view illustrating the structure of one pixel in the AMOLED according to the related art.
Figure 4:
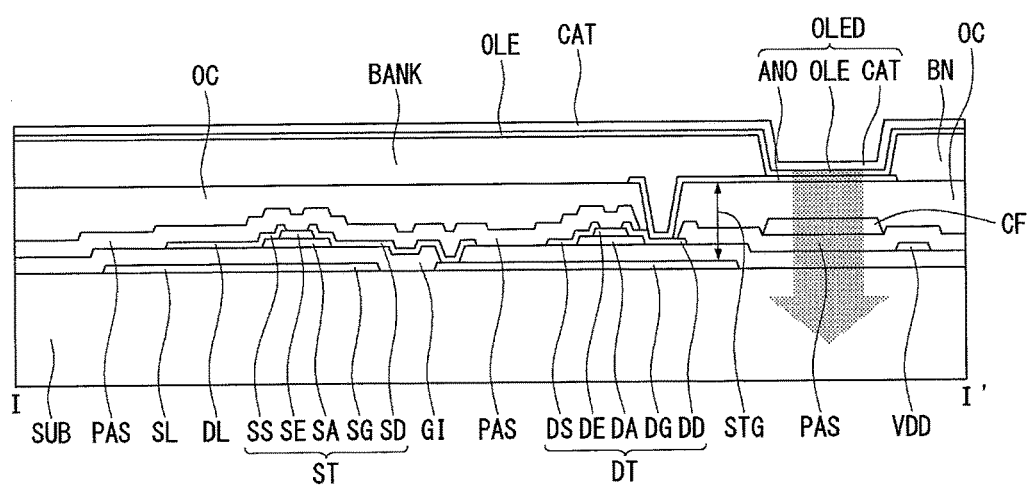
FIG. 4 is a cross-sectional view along the cutting line I-I' for illustrating the structure of the AMOLED according to the related art.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

Figure 5:
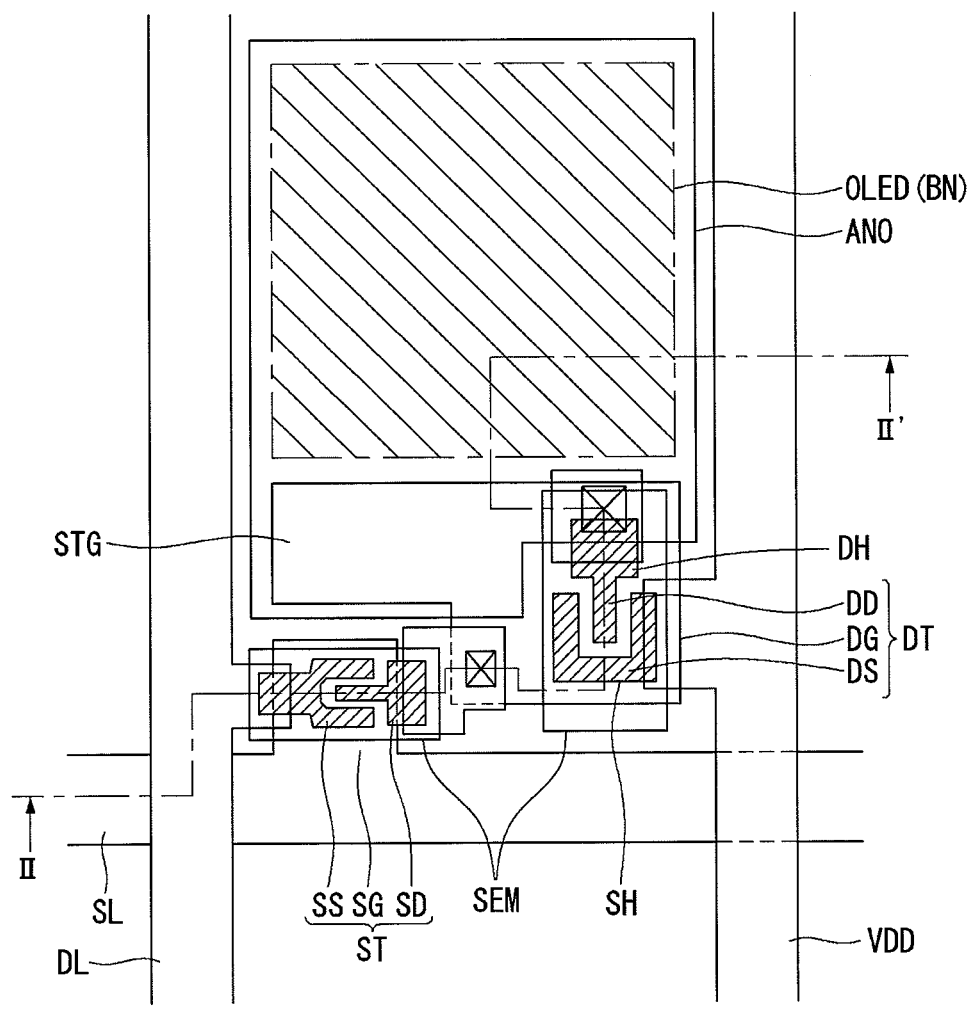
FIG. 5 is a plane view illustrating the structure of an organic light emitting diode display according to the first embodiment of the present disclosure.
Figure 6:
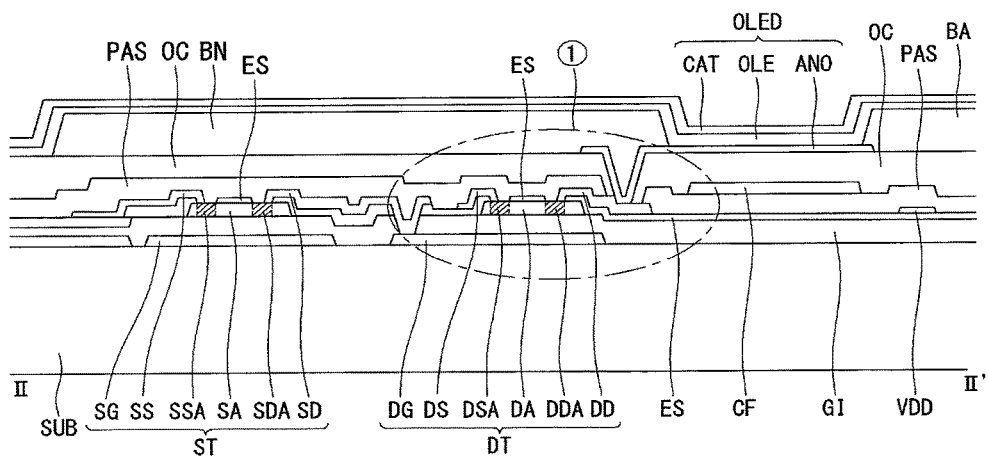
FIG. 6 is a cross-sectional view along the cutting line of II-IP in FIG. 5 for illustrating the structure of an organic light emitting diode display according to the first embodiment of the present disclosure.

Hereinafter, referring to FIGS. 5 and 6, we will explain about an organic light emitting diode display according to the first embodiment of the present disclosure. FIG. 5 is a plane view illustrating the structure of an organic light emitting diode display according to the first embodiment of the present disclosure. FIG. 6 is a cross-sectional view along the cutting line of II-IP in FIG. 5 for illustrating the structure of an organic light emitting diode display according to the first embodiment of the present disclosure.

Referring to FIGS. 5 and 6, an organic light emitting diode display according to the first embodiment of the present disclosure has gate electrodes SG and DG of the switching thin film transistor ST and the driving thin film transistor DT, respectively, formed on a substrate SUB. On the gate electrodes SG and DG the gate insulator GI is deposited. The semiconductor layers SA and DA are formed on some portions of the gate insulator GI overlapping with the gate electrodes SG and DG. On the semiconductor layers SA and DA, the source electrodes SS and DS and the drain electrodes SD and DD are facing each other respectively with certain distance. The drain electrode SD of the switching thin film transistor ST is connected to the gate electrode DG of the driving thin film transistor DT via the contact hole penetrating the gate insulator GI. The passivation layer PAS is deposited on the substrate SUB having the switching thin film transistor ST and the driving thin film transistor DT.

Especially, when the semiconductor layer SEM is made of oxide semiconductor materials, in order to ensure the stability of the elements, an etch stopper ES may be included for protecting the upper surface of the semiconductor layer SEM from the etchant. In detail, when patterning the source electrodes SS and DS and the drain electrodes SD and DD are formed by a photo-lithography method using an etchant, at the gap area between the source electrode and the drain electrode, the semiconductor layer SEM may be back-etched by the etchant. By forming the etch stopper ES on the upper surface of the channel area of the semiconductor layer SEM, the etch stopper ES can prevent the upper surface of the semiconductor layer SEM at this gap from being etched by the etchant.

In the first embodiment of the present disclosure, the etch stopper ES is formed as covering the whole surface of the substrate SUB having the semiconductor layer SEM is deposited. Further, the etch stopper ES has the open holes for defining the channel areas SA and DA of the semiconductor layer SEM, and the source area SSA and DSA and the drain area SDA and DDA continuously disposed at the right side and the left side of the channel area, respectively. In other words, the exposed area of the semiconductor layer SEM by the open holes of the etch stopper ES may be defined as the source areas SSA and DSA and the drain areas SDA and DDA. The middle portions of the semiconductor layer SEM covered by the etch stopper ES between the source areas SSA and DSA and the drain areas SDA and DDA are defined as the channel areas SA and DA.

Further, in the first embodiment of the present disclosure, the source electrodes SS and DS are connected to some portions of the source areas SSA and DSA, respectively. Therefore, the source electrodes SS and DS are not overlapped with the channel areas SA and DA. Also, the drain electrodes SD and DD are connected to some portions of the drain areas SDA and DDA, respectively.

Color filters CF may be formed at the area where the anode electrode ANO may be formed as a layer. It is preferable that the color filter CF has as large an area as possible. For example, the color filter CF may be overlapped with some portions of the data line DL, the driving current line VDD and the scan line SL. The upper surface of the substrate having these thin film transistors ST and DT and the color filter CF is not in even and/or smooth conditions, but in uneven and/or rugged conditions having different levels. To ensure that the organic light emitting diode display has good luminescent quality over the whole display area, the organic light emitting layer OLE should be formed on an even or smooth surface. So, to make the upper surface in planar and even conditions, the over coat layer OC is deposited on the whole surface of the substrate SUB.

Then, on the over coat layer OC, the anode electrode ANO of the organic light emitting diode OLED is formed. Here, the anode electrode ANO is connected to the drain electrode DD of the driving thin film transistor DT through the contact hole penetrating the over coat layer OC and the passivation layer PAS.

On the substrate SUB having the anode electrode ANO, a bank BANK is formed over the area having the switching thin film transistor ST, the driving thin film transistor DT and the various lines DL, SL and VDD, for defining the light emitting area. The exposed portion of the anode electrode ANO by the bank BANK may be the light emitting area. On the anode electrode ANO exposed from the bank BANK, the organic light emitting layer OLE is formed. On the organic light emitting layer OLE, the cathode electrode ACT is formed.

In the case that the organic light emitting layer OLE includes an organic material emitting white light, each pixel can represent its own color using the color filter CF disposed under the anode electrode ANO. The organic light emitting diode display having the structure shown in FIG. 6 may be the bottom emission type display.

Figure 7:
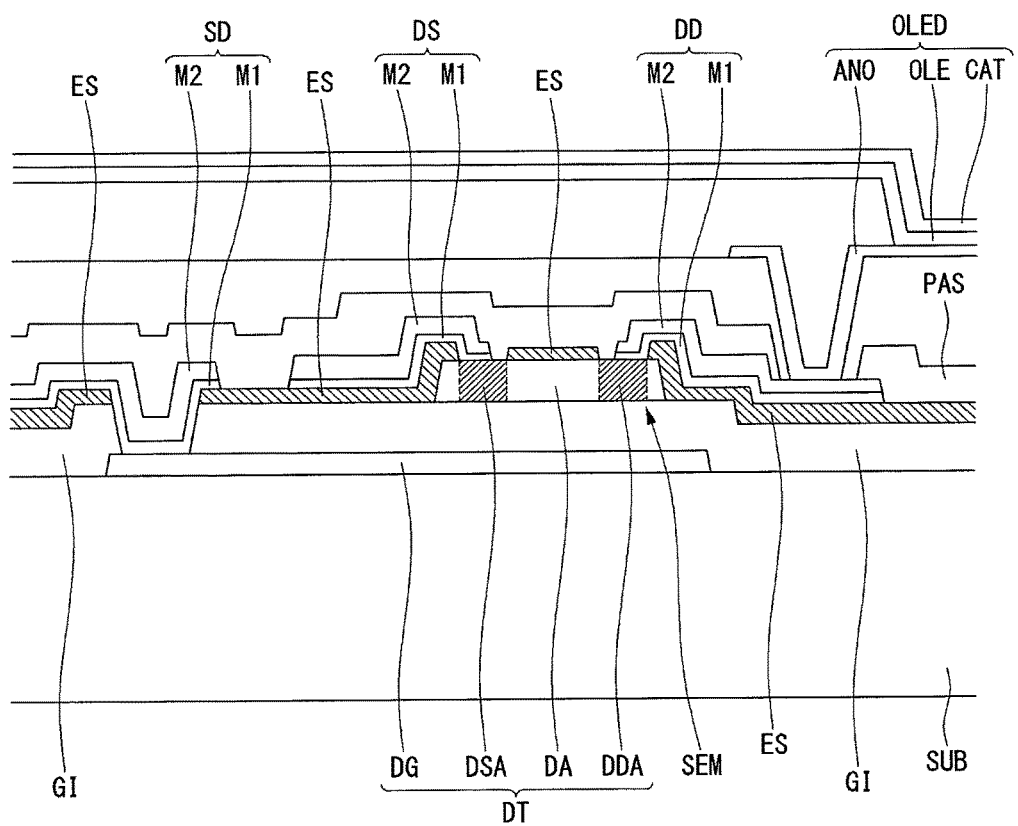
FIG. 7 is an enlarged cross-sectional view illustrating the '☐' area showing the structure of the driving thin film transistor in FIG. 6 according to the first embodiment of the present disclosure.

One of the main features of the present disclosure is on the structure of the thin film transistor including an oxide semiconductor material. Hereinafter, referring to FIG. 7, the structure of the thin film transistor in the organic light emitting diode display is described in more detail. FIG. 7 is an enlarged cross-sectional view illustrating the '☐' area showing the structure of the driving thin film transistor in FIG. 6 according to the first embodiment of the present disclosure.

Referring to FIG. 7, a gate electrode DG of the driving thin film transistor DT is formed on a substrate SUB. On the gate electrode DG a gate insulating layer GI is deposited. A semiconductor layer SEM is formed on the gate insulating layer GI as being overlapped with the gate electrode DG. On the whole surface of the substrate SUB having the semiconductor layer SEM, an etch stopper ES is deposited.

The etch stopper ES is patterned to expose the source area DSA and the drain area DDA of the semiconductor layer SEM. The exposed source area DSA and the drain area DDA may be conductorized (or metalized) by plasma treatment. As a result, the portions of the semiconductor layer SEM between the source area DSA and the drain area DDA may be defined as the channel area DA.

On the etch stopper ES, a source electrode DS and a drain electrode DD are formed. Especially, the source electrode DS is connected to the source area DSA exposed through the open hole of the etch stopper ES, especially, to some portions of the source area DSA apart from the channel area DA with a predetermined distance. In addition, the drain electrode DD is connected to the drain area DDA exposed through the open hole of the etch stopper ES, especially, to some portions of the drain area DDA apart from the channel area DA with a predetermined distance.

In accordance with one embodiment, the source electrode DS and the drain electrode DD may be made of a double-layered metal layer. For example, a first metal layer M1 may be disposed at the lower layer, and a second metal layer M2 may be disposed at the upper layer. The first metal layer M1 may be easily patterned by the wet etching method, but the second metal layer may be easily patterned by the dry etching method. Further, the data line DL extended from the source electrode DS may have the same structure. Likewise, the drain electrode SD of the switching thin film transistor ST connected to the gate electrode DG of the driving thin film transistor DT may have the same structure.

Under this structure, the channel area DA and the source-drain areas DSA and DDA can be defined by the shape (or profile) of the etch stopper ES. Therefore, the channel area DA has no portion overlapped with the source-drain electrodes DS and DD. As the result, the length of the channel area DA is decided by the pattern of the etch stopper ES, so that it is not required to consider any overlapping margin when designing the thin film transistor. It is possible to accurately design and form the thin film transistor to have a short length of channel by use of the pattern of the etch stopper ES.

Hereinafter, referring to FIGS. 8A to 8F, a method for manufacturing the thin film transistor is described. FIGS. 8A to 8F are cross-sectional views illustrating a method for manufacturing a thin film transistor substrate according to the first embodiment of the present disclosure.

Figure 8A:
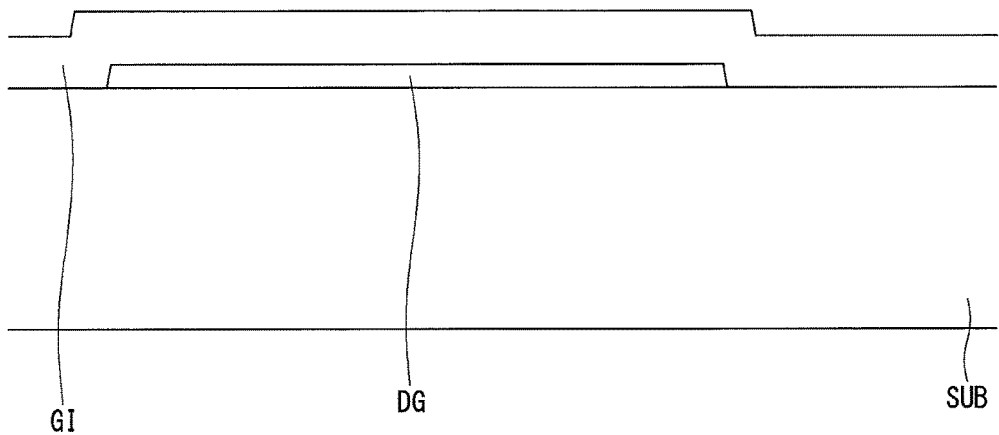
FIGS. 8A to 8F are cross-sectional views illustrating a method for manufacturing a thin film transistor substrate according to the first embodiment of the present disclosure.

As shown in FIG. 8A, on a transparent substrate SUB, a gate metal material is deposited and patterned in a first mask process to form the gate elements. The gate elements include a gate electrode DG (of the driving thin film transistor DT) and a scan line SL connecting the gate electrode DG. A gate insulating layer GI is deposited on the whole surface of the substrate SUB having the gate elements.

Figure 8B:
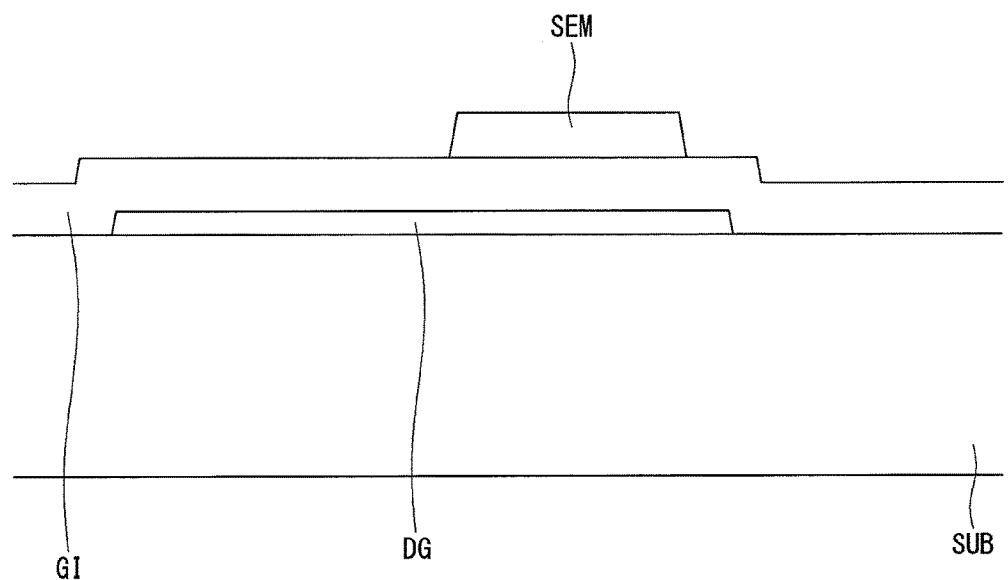

Depositing an oxide semiconductor material on the gate insulating layer GI and patterning in the second mask process, a semiconductor layer SEM is formed. The oxide semiconductor material includes the metal oxide material such as indium-gallium-zinc oxide (or IGZO). The semiconductor layer SEM is formed as overlapping with the gate electrode DG as shown in FIG. 8B.

Figure 8C:
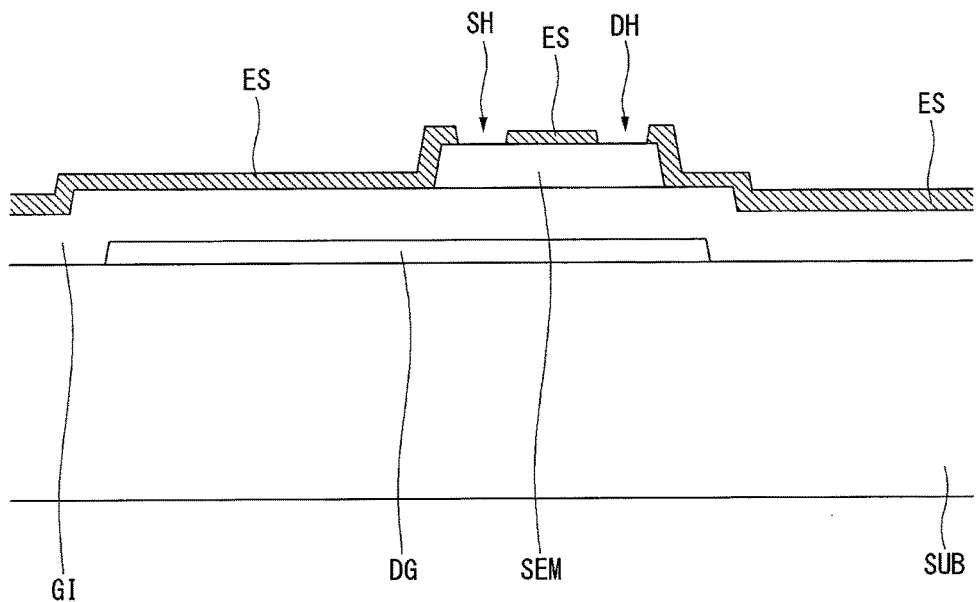

Depositing an insulating material on the whole surface of the substrate SUB having the semiconductor layer SEM, an etch stopper ES is formed. Patterning the etch stopper ES in the third mask process, a source area hole SH and a drain area hole DH are formed, as shown in FIG. 8C.

After forming the source area hole SH and the drain area hole DH, patterning the etch stopper ES and the gate insulating layer GI in the fourth mask process, a gate contact hole GH exposing some portions of the gate electrode DG is formed. As the manufacturing process explained in the first embodiment is for forming an organic light emitting diode display, the switching thin film transistor ST is connected to the driving thin film transistor DT. Therefore, the gate contact hole GH is required. However, in the method for manufacturing a liquid crystal display in which the gate contact hole is not necessary, this fourth mask process may be omitted.

Using the patterned etch stopper ES as a mask, a plasma treatment is conducted on the whole surface of the substrate SUB. Then, some portions of the semiconductor layer SEM exposed by the source area hole SH and the drain area hole DH penetrating the etch stopper ES are conductorized (or metalized).

The oxide semiconductor material has the characteristics in which the conductivity may be changed according to the content amount of the oxygen therein. The metal oxide semiconductor material such as indium-gallium-zinc oxide used in the semiconductor layer SEM in this application may have the semiconductor characteristics by controlling the content of the oxygen. Here, when reducing the oxygen content, the conductive characteristics may be increased so that the indium-gallium-zinc oxide may be conductorized. There are various methods for reducing the oxygen content during forming the semiconductor layer SEM. In order to reduce the oxygen content within a selected area, the plasma treatment is used. By conducting the plasma treatment on selected portions of the semiconductor layer SEM, the oxygen amount in the selected portions of the semiconductor layer can be removed so that those portions can be conductorized. In the plasma treatment, the helium (He) gas, the hydrogen (H2) gas or the argon (Ar) gas may be used.

Figure 8D:
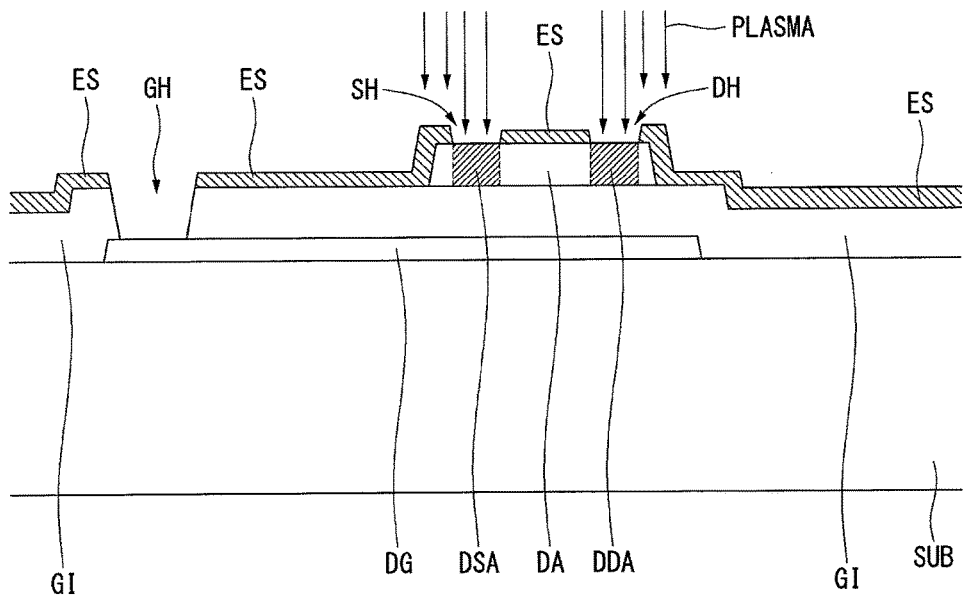

The conductorized areas of the semiconductor layer SEM may be defined as the source area DSA and the drain area DDA. At the same time, the portions of the semiconductor layer SEM covered by the etch stopper ES at the area between the source area hole SH and the drain area hole DH is defined as the channel area DA, as shown in FIG. 8D.

Figure 8E:
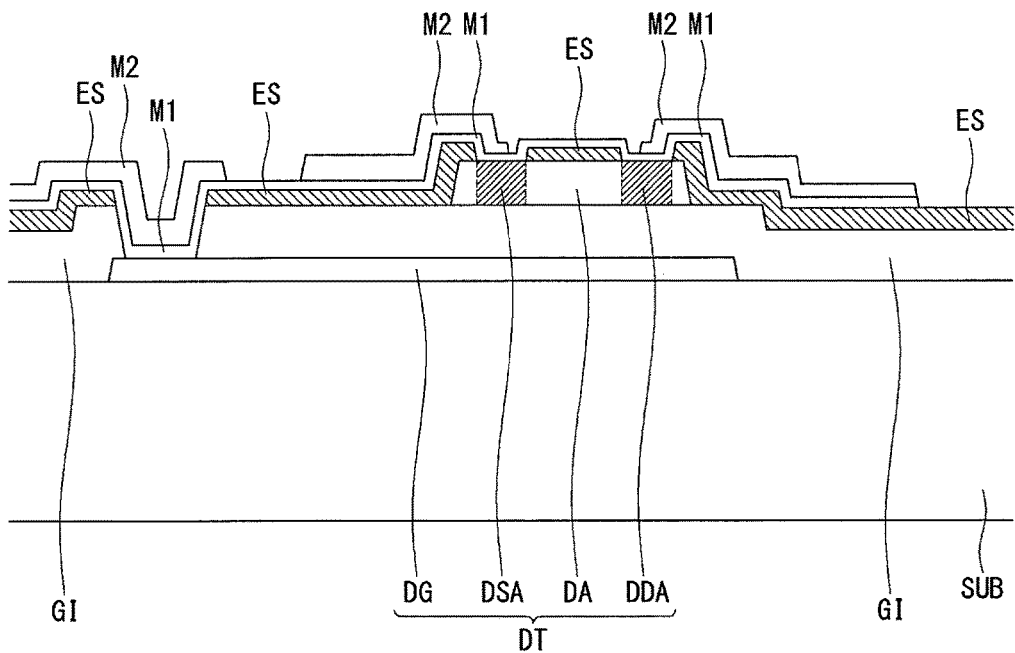

On the whole surface of the substrate SUB having the channel area DA and the source-drain area DSA and DDA, a source-drain metal is deposited. In detail, the first metal layer M1 and the second metal layer M2 are sequentially deposited. The first metal layer M1 may include a metal material or a conductive material such as the molybdenum (Mo), the titanium (Ti), the molybdenum-titanium alloy (MoTi) or the indium thin oxide (ITO). The first metal layer M1 may be deposited with the thickness of 1,000 Å or less. The second metal layer M2 may include a low resistance material such as the copper (Cu). In another example, the second metal layer M2 may include a metal material or a conductive material such as the copper (Cu) alloy, the molybdenum (Mo), the titanium (Ti), the molybdenum-titanium alloy (MoTi) or the indium thin oxide (ITO). The second metal layer M2 may be deposited with the thickness of 6,000 Å or less. It is preferable that the second metal layer M2 is thicker than the first metal layer M1. However, depending on the cases, the second metal layer M2 may be thinner than the first metal layer M1. In the fifth mask process, the second metal layer M2 is etched by the wet etching process, as the source-drain pattern, as shown in FIG. 8E.

Using the second metal layer M2 patterned in the source-drain shape as a mask, the first metal layer M1 is patterned by the dry etching process. As the result, the source-drain elements are completed. The source-drain elements include the source electrode DS and the drain electrode DD of the driving thin film transistor DT, the source electrode SS and the drain electrode SD of the switching thin film transistor ST, the data line DL and the driving current line VDD.

Figure 8F:
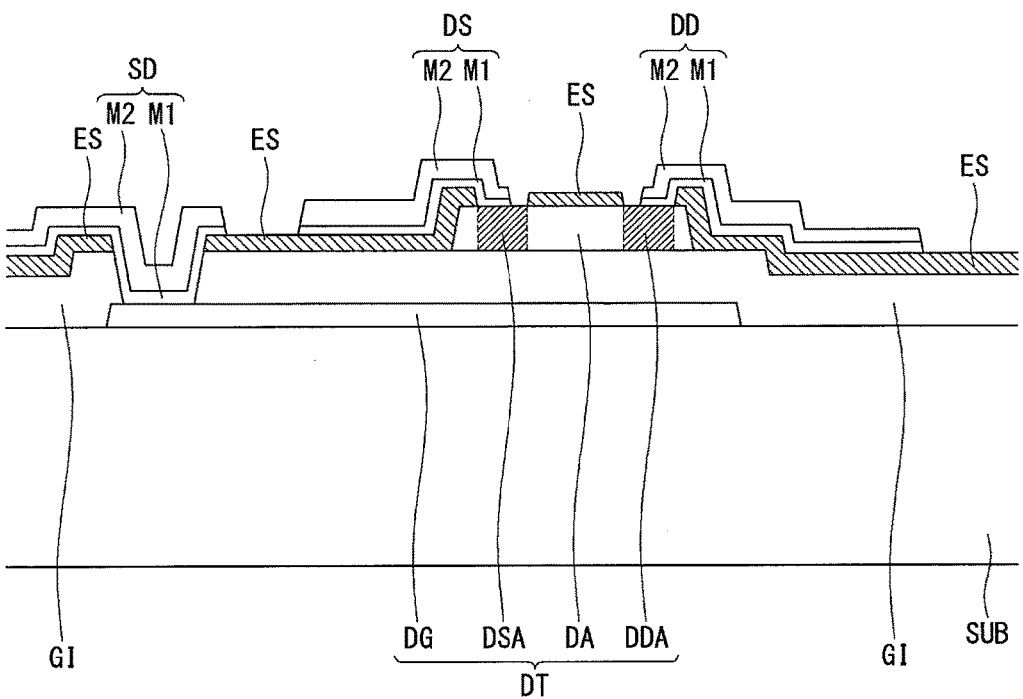

Especially, the source electrode DS contacts some portions of the source area DSA exposed through the source area hole SH formed at the etch stopper ES. In detail, the source electrode DS contacts some area of the source area DSA with a predetermined distance from the channel area DA to outside. Therefore, other portions of the source area DSA between the source electrode DS and the channel area DA are exposed. In addition, the drain electrode DD also contacts some area of the drain area DDA with a predetermined distance from the channel area DA to the outside. Then, other portions of the drain area DDA between the drain electrode DD and the channel area DA are also exposed, as shown in FIG. 8F.

In the case that the source-drain electrode DS and DD are formed as being overlapped with the etch stopper ES covering the channel area DA, the portions of the semiconductor layer SEM corresponding to the space between the source electrode DS and the drain electrode DD may be defined as the channel area. However, in the first embodiment of the present disclosure, the source-drain electrodes DS and DD are not overlapped with the channel area DA, so that the channel area DA may be exactly and/or precisely defined by the shape or pattern of the etch stopper ES.

As described above, when the source electrode DS and the drain electrode DD contact some portions of the source area DSA and the drain area DDA, respectively, and the other portions of the source area DSA and the drain area DDA are exposed, the exposed portions of the source area DSA and the drain area DDA may be damaged when patterning the source-drain elements. To prevent this damage, in the present disclosure, the source-drain elements include two metal layers. For example, in the wet etching process, the second metal layer M2 of the source-drain element is patterned in a fast takt time. After that, the first metal layer M1 thinner than the second metal layer M2 is patterned in the dry etching process using the patterned second metal layer M2 as a mask. The dry etching process requires longer takt time than the wet etching process, but it can control the etching thickness more precisely. Therefore, by combining the wet etching process and the dry etching process properly, it is possible to form the source-drain element without any damages on the exposed other portions of the source area DSA and the drain area DDA.

Figure 9:
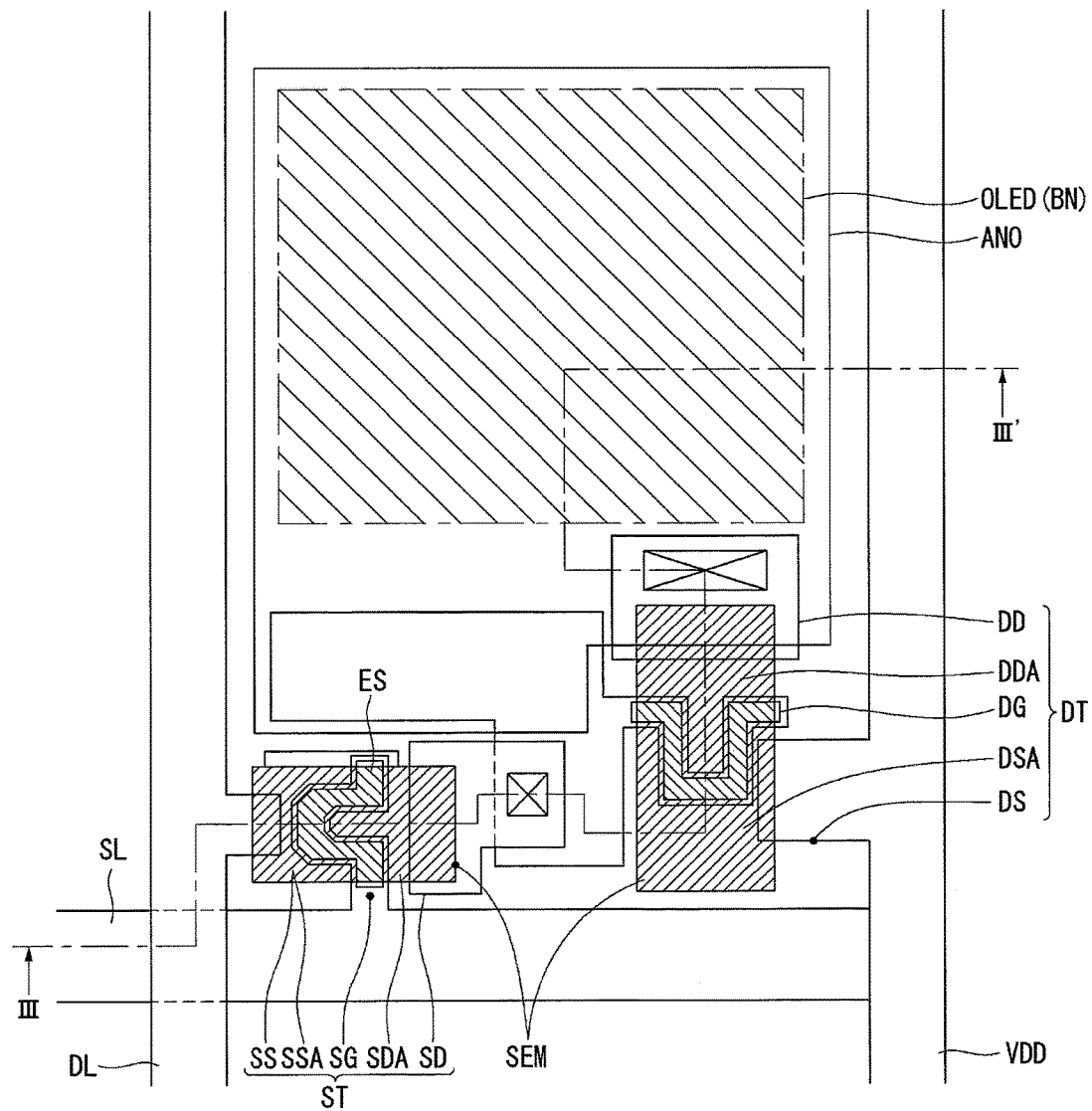
FIG. 9 is a cross-sectional view illustrating the structure of an organic light emitting diode display according to the second embodiment of the present disclosure.
Figure 10:
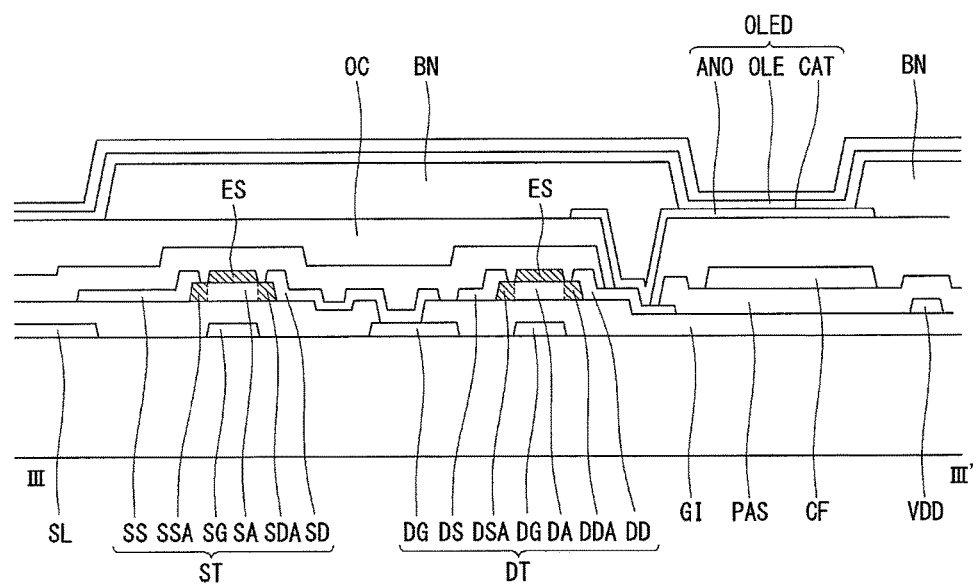
FIG. 10 is a cross-sectional view along the cutting line of III-III' in FIG. 9 for illustrating the structure of an organic light emitting diode display according to the second embodiment of the present disclosure.

Hereinafter, referring to FIGS. 9 and 10, a second embodiment of the present disclosure is described. FIG. 9 is a cross-sectional view illustrating the structure of an organic light emitting diode display according to the second embodiment of the present disclosure. FIG. 10 is a cross-sectional view along the cutting line of III-III' in FIG. 9 for illustrating the structure of an organic light emitting diode display according to the second embodiment of the present disclosure.

The basic structure of the organic light emitting diode display according to the second embodiment of the present disclosure is very similar with the first embodiment. Therefore, the explanation about the same structure would be omitted and we will mainly explain on the differences.

In the second embodiment, the channel areas SA and DA and the etch stopper ES is defined and/or formed using the shape of the gate electrodes SG and DG. That is, the channel area of the thin film transistor is defined by the pattern of the gate electrode. In detail, the gate electrode is formed by the designed channel area in the thin film transistor, the etch stopper is formed by the back exposure method using the gate electrode as a mask, and the channel area and the source-drain areas are defined using the etch stopper.

Referring to FIGS. 9 and 10, the organic light emitting diode display according the second embodiment includes a gate electrode SG of the switching thin film transistor ST and a gate electrode DG of the driving thin film transistor DT formed on a substrate SUB. On the gate electrodes SG and DQ a gate insulating layer GI is deposited. On the gate insulating layer GI, a semiconductor layer SEM is formed in which the semiconductor layer SEM includes the channel areas SA and DA having the same shape with the gate electrodes SG and DG, and the source-drain areas SSA-SDA and DSA-DDA extended at both sides of the channel areas SA and DA, respectively.

On the channel areas SA and DA, the etch stopper ES having the same shape with the gate electrodes SG and DG and the channel areas SA and DA is formed. The source-drain areas SSA-SDA and DSA-DDA extended from both sides of the channel areas SA and DA contact the source-drain electrodes SS-SD and DS-DD, respectively. Especially, the source electrodes SS and DS contact some portions of the source areas SSA and DSA, respectively. In detail, the source electrodes SS and DS contact some portions of the source areas SSA and DSA which are apart from the channel areas SA and DA with a predetermined distance to the outside. The drain electrodes SD and DD contact some portions of the drain areas SDA and DDA which are apart from the channel areas SA and DA with a predetermined distance to the outside.

In the second embodiment, the etch stopper ES and the channel areas SA and DA are formed using the shape and/or the profile of the gate electrodes SG and DG. In the first embodiment, the etch stopper ES is deposited on the whole surface of the substrate except the source-drain areas SSA-SDA and DSA-DDA. However, in the second embodiment, the etch stopper ES exists on the channel areas SA and DA only.

Hereinafter, referring to FIGS. 11A to 11F, a method for manufacturing the thin film transistor substrate according to the second embodiment of the present disclosure is described. FIGS. 11A to 11F are cross-sectional views illustrating a method for manufacturing a thin film transistor substrate for the organic light emitting diode display according to the second embodiment of the present disclosure.

Figure 11A:
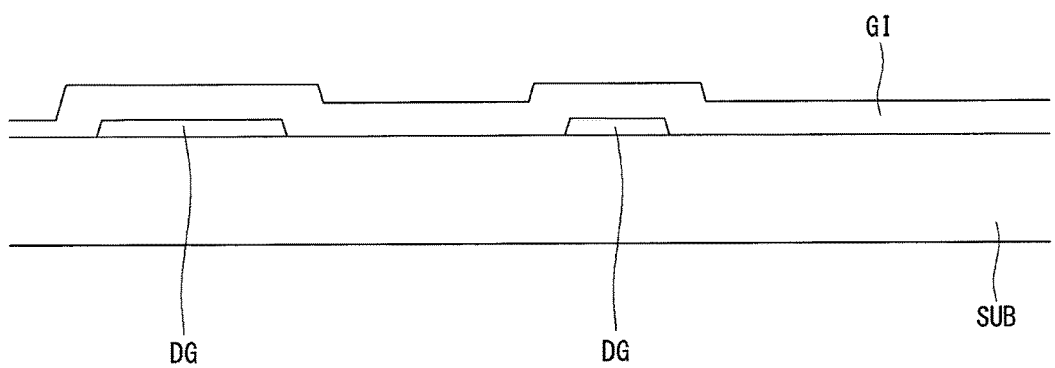
FIGS. 11A to 11F are cross-sectional views illustrating a method for manufacturing a thin film transistor substrate for the organic light emitting diode display according to the second embodiment of the present disclosure.

As shown in FIG. 11A, on a transparent substrate SUB, a gate metal material is deposited and patterned in a first mask process to form the gate elements. The gate elements include a gate electrode DG (of the driving thin film transistor DT) and a scan line SL connecting the gate electrode DG. It is preferable that the shape of the gate electrode DG is designed as having the same size and shape with those of the channel area DA to be formed later. A gate insulating layer GI is deposited on the whole surface of the substrate SUB having the gate elements.

Figure 11B:
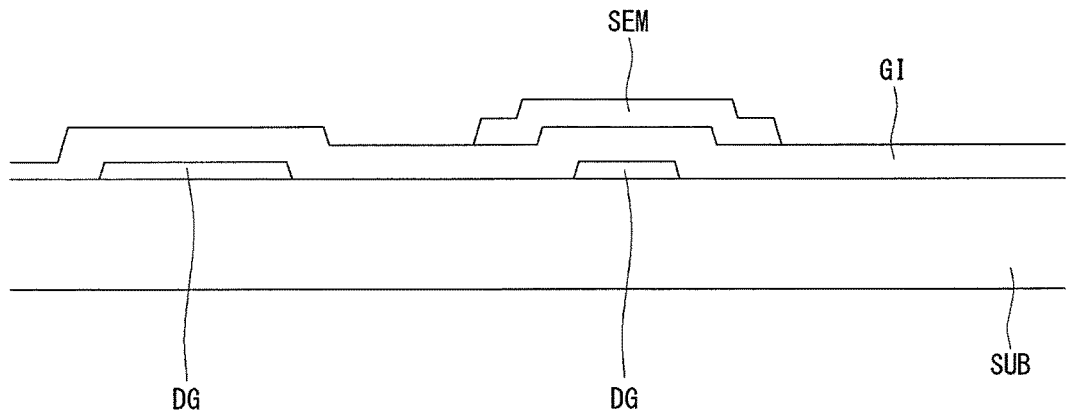

Depositing an oxide semiconductor material on the gate insulating layer GI and patterning in the second mask process, a semiconductor layer SEM is formed. The oxide semiconductor material includes the metal oxide material such as the indium-gallium-zinc oxide (or IGZO). The semiconductor layer SEM is formed as being larger than the gate electrode as shown in FIG. 11B.

Figure 11C:
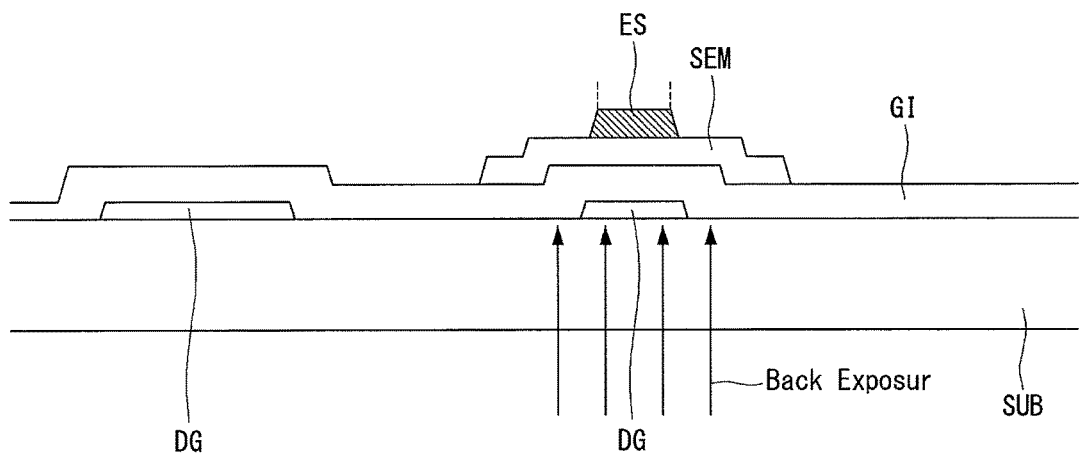

By depositing an insulating material on the whole surface of the substrate SUB having the semiconductor layer SEM, an etch stopper ES is formed. The etch stopper ES is patterned in the third mask process. No any additional photo mask, the etch stopper ES is patterned with the back exposure method using the gate electrode DG as a mask, as shown in FIG. 11C.

After forming the etch stopper ES, by patterning the gate insulating layer GI in the fourth mask process, a gate contact hole GH exposing some portions of the gate electrode DG is formed. Similar to the manufacturing process explained in the first embodiment for forming an organic light emitting diode display, the switching thin film transistor ST is connected to the driving thin film transistor DT. Therefore, the gate contact hole GH is required. However, in the method for manufacturing a liquid crystal display in which the gate contact hole is not necessary, this fourth mask process may be omitted.

Figure 11D:
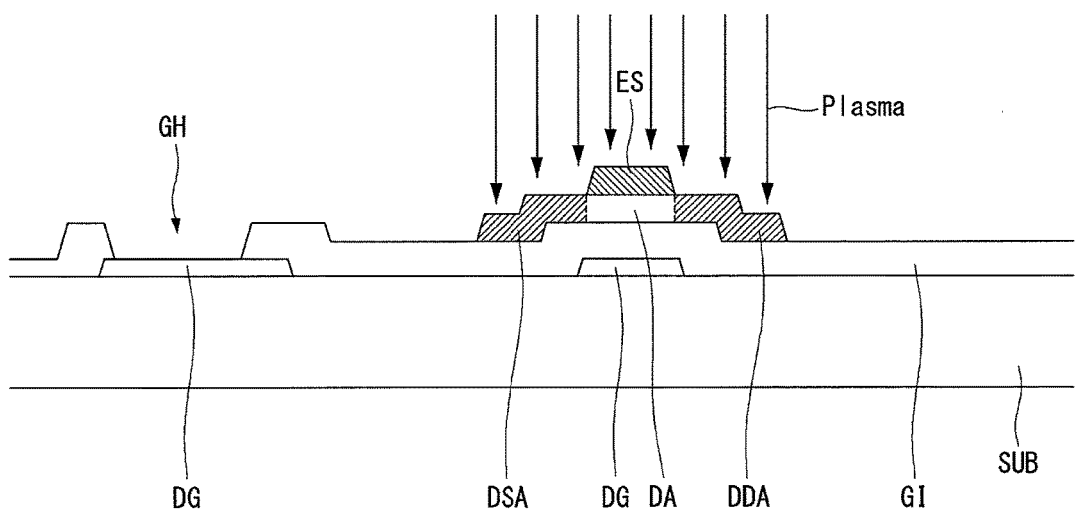

By using the patterned etch stopper ES as a mask, a plasma treatment is conducted on the whole surface of the substrate SUB. Then, some portions of the semiconductor layer SEM exposed by the etch stopper ES are conductorized (or metalized). The conductorized areas of the semiconductor layer SEM may be defined as the source area DSA and the drain area DDA. At the same time, the portions of the semiconductor layer SEM covered by the etch stopper ES at the area between the source area DSA and the drain area DDA is defined as the channel area DA, as shown in FIG. 11D.

Figure 11E:
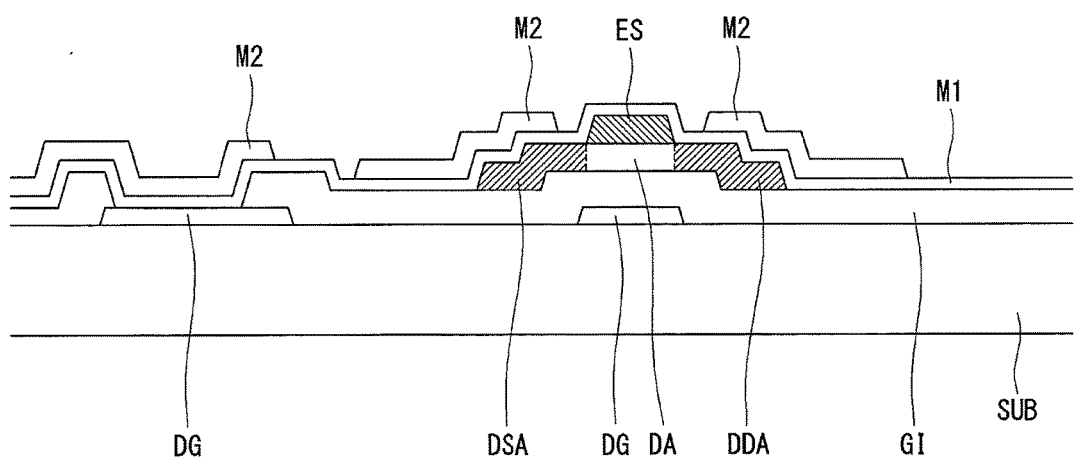

On the whole surface of the substrate SUB having the channel area DA and the source-drain area DSA and DDA, a source-drain metal is deposited. In detail, the first metal layer M1 and the second metal layer M2 are sequentially deposited. The first metal layer M1 may include a metal material or a conductive material such as the molybdenum (Mo), the titanium (Ti), the molybdenum-titanium alloy (MoTi) or the indium thin oxide (ITO). The first metal layer M1 may be deposited with the thickness of 1,000 Å or less. The second metal layer M2 may include a low resistance material such as the copper (Cu). In another example, the second metal layer M2 may include a metal material or a conductive material such as the copper (Cu) alloy, the molybdenum (Mo), the titanium (Ti), the molybdenum-titanium alloy (MoTi) or the indium thin oxide (ITO). The second metal layer M2 may be deposited with the thickness of 6,000 Å or less. It is preferable that the second metal layer M2 is thicker than the first metal layer M1. However, depending on the cases, the second metal layer M2 may be thinner than the first metal layer M1. In the fifth mask process, the second metal layer M2 is etched by the wet etching process, as the source-drain pattern, as shown in FIG. 11E.

By using the second metal layer M2 patterned in the source-drain shape as a mask, the first metal layer M1 is patterned by the dry etching process. As a result, the source-drain elements are completed. The source-drain elements include the source electrode DS and the drain electrode DD of the driving thin film transistor DT, the source electrode SS and the drain electrode SD of the switching thin film transistor ST, the data line DL and the driving current line VDD.

Figure 11F:
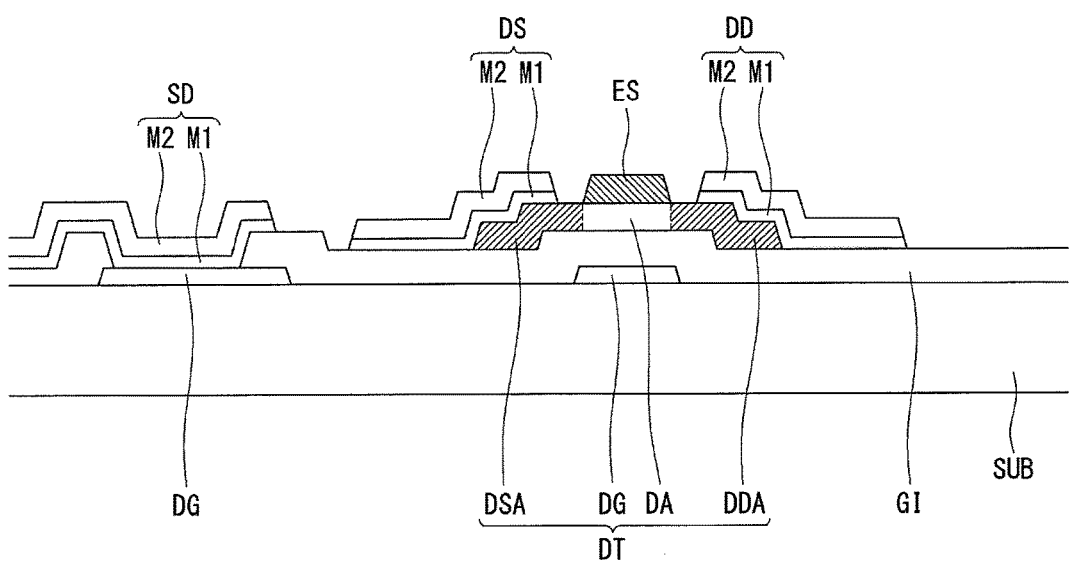

Especially, the source electrode DS contacts some portions of the source area DSA exposed at the one outside direction of the etch stopper ES. In detail, the source electrode DS contacts some area of the source area DSA with a predetermined distance from the channel area DA to outside. Therefore, other portions of the source area DSA between the source electrode DS and the channel area DA are exposed. Further, the drain electrode DD also contacts some area of the drain area DDA exposed at the other outside direction of the etch stopper ES, with a predetermined distance from the channel area DA to the outside. Then, other portions of the drain area DDA between the drain electrode DD and the channel area DA are also exposed, as shown in FIG. 11F.

In the case that the source-drain electrode DS and DD are formed as being overlapped with the etch stopper ES covering the channel area DA, the portions of the semiconductor layer SEM corresponding to the space between the source electrode DS and the drain electrode DD may be defined as the channel area. However, in the second embodiment of the present disclosure, the source-drain electrodes DS and DD are not overlapped with the channel area DA, so that the channel area DA may be exactly and/or precisely defined by the shape or pattern of the etch stopper ES.

Especially, in the second embodiment, the thin film transistor has the self-aligned structure in which the source-drain electrodes DS and DD are not overlapped with the gate electrode DG. Therefore, the parasitic capacitances formed between the gate electrode and the source electrode and/or between the gate electrode and the drain electrode can be minimized or eliminated. Consequently, while the thin film transistor has a bottom gate structure, it has the merit of a top gate structure in which the gate electrode DG and the source-drain electrodes DS and DD are self aligned.

While the embodiment of the present invention has been described in detail with reference to the drawings, it will be understood by those skilled in the art that the invention can be implemented in other specific forms without changing the technical spirit or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A method for manufacturing an organic light emitting diode (OLED) display, the method comprising:
    forming a gate electrode on a substrate;
    forming a semiconductor layer having a source area, a drain area and a channel area between the source area and the drain area by depositing a gate insulating layer and an oxide semiconductor material and patterning the oxide semiconductor material;
    forming an etch stopper on the semiconductor layer and the gate insulation layer to expose a portion of the source area and a portion of the drain area of the semiconductor layer;
    conducting a plasma treatment using the etch stopper as a mask to conductorize the portion of the source area and the portion of the drain area of the semiconductor layer exposed by the etch stopper for defining the channel area, the source area and the drain area; and
    forming a source electrode contacting the portion of the conductorized source area and a drain electrode contacting the portion of the conductorized drain area,
    wherein the forming the source electrode and the drain electrode includes:
        depositing a first metal layer and a second metal layer sequentially on the etch stopper;
        patterning the second metal layer with an wet etching method; and
        patterning the first metal layer with a dry etching method using the patterned second metal layer as a mask,
    wherein the source electrode contacts a surface of the portion of the source area that is apart from the channel area with a first predetermined distance,
    wherein the drain electrode contacts a surface of the portion of the drain area that is apart from the channel area with a second predetermined distance, and
    wherein the etch stopper includes a first portion disposed on a portion of the gate insulation layer and a portion of the source area at a position in which the first portion overlaps the gate electrode, a second portion disposed on the channel area at a position in which the second portion overlaps the gate electrode, and a third portion disposed on another portion of the gate insulation layer and a portion of the drain area at a position in which the third portion overlaps the gate electrode.

2. The method according to claim 1, wherein the step of forming the etch stopper includes:
    depositing an insulating layer on the semiconductor layer; and
    forming a source area hole exposing the source area and a drain area hole exposing the drain area by patterning the insulating layer using a mask.

3. The method according to claim 1, wherein the first metal layer and the second metal layer of the source and drain electrodes have a same shape and size, respectively.

4. The method according to claim 1, wherein the step of conducting the plasma treatment includes reducing an oxygen content in the exposed portions of the semiconductor layer.

5. The method according to claim 1, wherein the step of conducting the plasma treatment includes aligning a first end of the etch stopper with a boundary between the channel area and the source area and a second end of the etch stopper with a boundary between the channel area and the drain area.

6. The method according to claim 1, wherein the conductorized source and drain areas extend from a top surface of the semiconductor layer to a bottom surface of the semiconductor layer.

7. The method according to claim 1, wherein the source electrode is disposed on the first portion of the etch stopper and the conductorized source area exposed between the first portion of the etch stopper and the second portion of the etch stopper.

8. The method according to claim 7, wherein the drain electrode is disposed on the third portion of the etch stopper and the conductorized drain area exposed between the second portion of the etch stopper and the third portion of the etch stopper.

9. The method according to claim 1, wherein the gate electrode overlaps with the source area and the drain area and extends past outer edges of the source area and the drain area.

10. The method according to claim 1, wherein the first metal layer is thinner than the second metal layer.

\* \* \* \* \*